United States Patent
Sarokhan

(10) Patent No.: US 10,933,958 B2
(45) Date of Patent: Mar. 2, 2021

(54) ELECTRIC POWER GENERATION AND STORAGE BUOY

(71) Applicant: Ocean Power Technologies, Inc., Pennington, NJ (US)

(72) Inventor: Joseph Sarokhan, Basking Ridge, NJ (US)

(73) Assignee: Ocean Power Technologies, Inc., Monroe Township, NJ (US)

( * ) Notice: Subject to any disclaimer, the term of this patent is extended or adjusted under 35 U.S.C. 154(b) by 0 days.

(21) Appl. No.: 16/540,286

(22) Filed: Aug. 14, 2019

(65) Prior Publication Data

US 2020/0055574 A1    Feb. 20, 2020

Related U.S. Application Data

(60) Provisional application No. 62/718,574, filed on Aug. 14, 2018, provisional application No. 62/815,857, filed on Mar. 8, 2019.

(51) Int. Cl.
| | |
|---|---|
| *B63B 35/44* | (2006.01) |
| *H02S 10/10* | (2014.01) |
| *H02S 10/20* | (2014.01) |
| *H02S 10/40* | (2014.01) |
| *B63B 22/24* | (2006.01) |

(Continued)

(52) U.S. Cl.
CPC ............. *B63B 35/44* (2013.01); *B63B 22/24* (2013.01); *H01L 35/30* (2013.01); *H02K 7/1815* (2013.01);

(Continued)

(58) Field of Classification Search
CPC ... B63B 22/00–22/28; B63B 2022/006; B63B 2022/028; B63B 2035/4433;

(Continued)

(56) References Cited

U.S. PATENT DOCUMENTS 3,447,314 A * 6/1969 Majkrzak ................ F01D 25/22
  60/657
3,449,589 A * 6/1969 Majkrzak ................ F01D 15/10
  290/2

(Continued)

FOREIGN PATENT DOCUMENTS

| CA | 736597 A1 | 6/1966 |
| JP | 2001278183 A1 | 10/2001 |
| JP | 5978963 B2 | 6/2014 |

OTHER PUBLICATIONS

Matray, J., International Search Report and Written Opinion (dated Nov. 19, 2019), European Patent Office as ISA, Netherlands.

*Primary Examiner* — Mark A Laurenzi
*Assistant Examiner* — Mickey H France
(74) *Attorney, Agent, or Firm* — Jonathan Pierce; Pierre Campanac; Porter Hedges LLP

(57) ABSTRACT

A system includes a fuel burner disposed within a buoy, and at least one fuel tank coupled to the fuel burner. The fuel tank preferably contains ethanol or propane. The system comprises either a thermoelectric generator or an electrical generator mechanically coupled to a heat engine. The ethanol or propane is burned to generate electric power. At least a portion of the electric power that is generated is stored in a battery system so that the system can provide peak levels of electric power consumption that are relatively large. The system can be used in autonomous marine applications.

18 Claims, 3 Drawing Sheets

(51) Int. Cl.
  *H01L 35/30*   (2006.01)
  *H02K 7/18*   (2006.01)
(52) U.S. Cl.
  CPC .............. *H02S 10/10* (2014.12); *H02S 10/20* (2014.12); *H02S 10/40* (2014.12); *B63B 2035/4433* (2013.01)
(58) Field of Classification Search
  CPC ....... B63B 2035/444; B63B 2035/4453; F02G 2243/00–2243/54; F03G 7/04; F03G 7/05
  USPC ....... 60/643–685, 698–720, 508–531, 641.6, 60/641.7; 441/1–34; 290/2
  See application file for complete search history.

(56) References Cited

U.S. PATENT DOCUMENTS

| | | | | |
|---|---|---|---|---|
| 3,506,841 | A * | 4/1970 | Majkrzak | F01D 15/10 290/2 |
| 3,704,499 | A * | 12/1972 | Majkrzak | F01K 25/12 29/890.142 |
| 3,779,466 | A * | 12/1973 | Majkrzak | F01K 7/16 239/489 |
| 4,348,169 | A * | 9/1982 | Swithenbank | F23N 1/022 431/89 |
| 4,498,876 | A * | 2/1985 | Zemlicka | F01N 13/085 137/527.8 |
| 9,382,902 | B1 | 7/2016 | Hiller | |
| 2009/0152868 | A1* | 6/2009 | Beck | H02K 7/1823 290/52 |
| 2009/0223508 | A1* | 9/2009 | Hinderling | F24S 30/422 126/628 |
| 2012/0047705 | A1* | 3/2012 | Yekutiely | H02S 20/00 29/428 |
| 2012/0279222 | A1 | 11/2012 | Sigworth et al. | |
| 2017/0030339 | A1* | 2/2017 | Proudfoot | F03G 7/00 |
| 2017/0129572 | A1* | 5/2017 | Mellor | B63G 8/24 |
| 2018/0094548 | A1* | 4/2018 | Jeter | C10G 7/00 |
| 2018/0119680 | A1* | 5/2018 | Jones | F03G 7/05 |

\* cited by examiner

ELECTRIC POWER GENERATION AND STORAGE BUOY

CROSS-REFERENCE TO RELATED APPLICATIONS

This application claims the benefit of priority to U.S. provisional application Ser. No. 62/718,574, filed on Aug. 14, 2018, which is included herein by reference. This application also claims the benefit of priority to U.S. provisional application Ser. No. 62/815,857, filed on Mar. 8, 2019, which is included herein by reference.

BACKGROUND

The disclosure relates to the generation and storage of electric power for use in autonomous marine applications.

Diesel engines have been used on buoys or barges at sea to provide electric power in remote areas, and marine diesel engine technology is mature. Diesel engines are reliable in marine environments when well protected and properly maintained. However, diesel engines may not be suitable for use in autonomous, long-duration applications, especially where the risk of heavy seas is high. For example, diesel engines require frequent maintenance, such as oil changes. Diesel engine maintenance every few weeks of operation would incur excessive costs. Further, since diesel engines use internal combustion, the combustion chamber is directly exposed to the marine air and salt contamination. If the engine air intake inflows sea water during heavy seas, the engine could be flooded and permanently damaged. Still further, a fuel leak (i.e., a diesel leak) could leave an oil slick or create an environmental hazard. Finally, diesel fuel is not suitable for long-duration deployments since the diesel fuel can degrade, gel, or clog injection nozzles over time. Biodiesel is also prone to bacteria growth issues when stored for long durations.

Solar panels have also been used at sea on buoys or barges to provide electric power in remote areas. However, the electric power generated by solar panels is limited during periods of cloudy weather and at night.

Wave energy converters (WECs) may produce too little electric power in deployment sites with poor wave energy potential or seasonal variations.

Therefore, there is a continuing need in the art for a system for the generation and storage of electric power that can be used in autonomous marine applications. The system would preferably be capable of generating electric power in remote marine environments in a clean, environment-friendly way. Also, the system would preferably be reliable and requires minimal maintenance.

BRIEF DESCRIPTION OF THE DRAWINGS

For a more detailed description of the embodiments of the disclosure, reference will now be made to the accompanying drawings, wherein.

DETAILED DESCRIPTION

Figure 1:
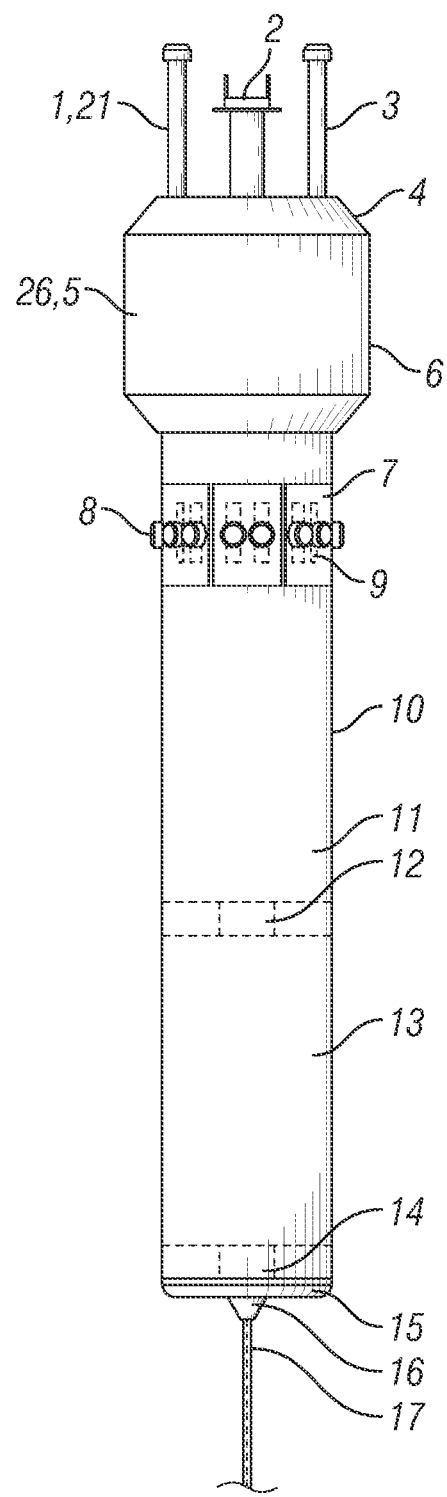
FIG. 1 is a view of a large vertical spar with multiple generators.

It is to be understood that the following disclosure describes several exemplary embodiments for implementing different features, structures, or functions of the invention. Exemplary embodiments of components, arrangements, and configurations are described below to simplify the disclosure; however, these exemplary embodiments are provided merely as examples and are not intended to limit the scope of the invention. Additionally, the disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Finally, the exemplary embodiments presented below may be combined in any combination of ways, i.e., any element from one exemplary embodiment may be used in any other exemplary embodiment, without departing from the scope of the disclosure.

All numerical values in this disclosure may be approximate values unless specifically stated otherwise. Accordingly, various embodiments of the disclosure may deviate from the numbers, values, and ranges disclosed herein without departing from the intended scope. Moreover, the formation of a first feature over or on a second feature in the description that follows may include embodiments in which the first and second features are formed in direct contact, and may also include embodiments in which additional features may be formed interposing the first and second features such that the first and second features may not be in direct contact.

The disclosure describes a system for the generation and storage of electric power, which can be used in autonomous marine applications. The system can be deployed in remote areas of the ocean where there is no access to the electric power grid.

The system comprises an electric power generation buoy that includes an equipment platform, which can be provided with a variety of communications equipment and sensors to be installed on top of the electric power generation buoy. The buoy can use a very simple single-point mooring or can be fitted with a station-keeping system.

The system includes means for converting a temperature difference into a voltage. As used herein, said means comprises either a thermoelectric generator having a hot side and a cold side, or an electrical generator mechanically coupled to a heat engine having a hot side and a cold side, or a combination of said thermoelectric generator with said electrical generator mechanically coupled to said heat engine. In some embodiments, the thermoelectric generator may comprise an array of pairs of dissimilar semiconductors configured to generate a voltage by Seebeck effect. In some embodiments, the electrical generator may comprise an alternator and an AC-to-DC converter. In some embodiments, the heat engine may comprise an external combustion heat engine. In some embodiments, the external combustion heat engine may comprise a Stirling-cycle engine.

In some preferred embodiments, the system uses either a Stirling-cycle engine coupled to an electric generator or thermoelectric generators to generate electric power. Stirling-cycle engines and thermoelectric generators use heat generated by fuel combustion in a chamber. In cases of accidental water inflow during a storm, or even in cases of flooding of the external combustion chamber, the combustion chamber can be automatically drained and re-ignited without incurring damage. The fuels are stored in tanks.

In some preferred embodiments, the system has the ability to generate electric power from environmentally friendly fuels such as ethanol or propane and store the generated electric power in a battery system. Optionally, the system also uses solar panels to supplement thermal electric power generation with solar electric power.

In operation, the system can use the battery system to allow peak levels of electric power consumption that are higher than the maximum level of electric power generated by the system, or to allow electric power consumption when sea conditions require intake and/or exhaust of the external combustion chamber to be closed, thereby preventing the generation of heat. Also, because Stirling-cycle engines are completely sealed from the outside environment, and thermoelectric generators have no moving parts, no oil changes may be required during operation.

The electric power generation and storage buoy described herein can provide average electric power in the order of 50 Watts to 1000 Watts for a duration ranging from a few months to over two years (typically over 12 months) after deployment. For example, the electric power generation and storage buoy can be used in an application to power telephone (e.g., 4G) and/or satellite communication transponders, camera systems, security sensors, autonomous underwater vehicles (AUVs), to charge undersea batteries, and/or to support data transmission. In addition, several electric power generation and storage buoys can be installed in arrays in instances when more than 1000 Watts of electric power are needed, e.g., when up to 100,000 Watts are needed.

Compared to WECs, electric power generated by the electric power generation and storage buoy described herein can be less dependent on deployment site conditions. In particular, the electric power generation and storage buoy can provide electric power in an environment where solar or wave energy alone is insufficient to meet the power requirements of the application. The combination of fuel and battery can provide a large amount of stored energy so that the electric power generation and storage buoy can operate reliably across all seasons and sea states with a high level of uptime availability.

The electric power generation and storage buoy described herein can rely on ethanol or propane combustion to generate electric power. Ethanol and propane are non-toxic if spilled, and do not create an oil slick. Ethanol is considered safer than ordinary gasoline since it is less toxic, has a higher flash point, higher auto-ignition temperature, and fires can be extinguished with pumped seawater via dilution, while gasoline fires require foam to extinguish and can float and burn on the water surface. Unlike diesel, ethanol has no shelf life limitations, and none of the bacteria growth issues associated with biodiesel. Ethanol is also considered clean/renewable energy. An ethanol flame is visible, other alcohols such as methanol are more dangerous since they burn with a light blue or invisible flame. After recovery, the fuel system can be flushed with distilled water or simply vented to allow any remaining ethanol to evaporate prior to shipment. In contrast, fuels such as diesel or gasoline can leave residues of flammable compounds in tanks and fuel lines even after venting. These residues can increase the risk of fuel system clogs or fuel-air explosions when transporting nearly empty tanks. Propane can also be used as a readily available clean-burning fuel that can be stored for long periods of time without degradation.

In some embodiments, the electric power generation and storage buoy described herein can be made compact and can have little drag in water. The buoy can therefore generate sufficient electric power to make station keeping a viable option. Also, the buoy may be relatively easy to transport. For example, multiple buoys can fit in a standard shipping container. Alternatively, when the outer shell of the buoy is shaped like a boat hull, the buoy can also be towed to a deployment site, thus eliminating the need for marine cranes.

In some cases, it may be cost effective to deploy a relatively large number of electric power generation and storage buoys that are all relatively small and thus easy to transport. In other cases, it may be cost effective to deploy a relatively small number of electric power generation and storage buoys that are all relatively large and thus may be difficult to transport.

In some embodiments, an outer shell of the electric power generation buoy can include a relatively large vertical spar appended to the bottom of a foam float. The outer shell of the foam float can be shaped essentially like a relatively small solid cylinder, optionally having truncated edges. The fuel tanks may be enclosed in the spar. The means for converting a temperature difference into a voltage may also be enclosed in the spar, such as above the fuel tanks. The battery system may be enclosed in the foam float.

In other embodiments, the vertical spar may be omitted, and the outer shell of the electric power generation buoy can essentially consist of a foam float. In such embodiments, the fuel tanks may also be enclosed in the foam float, such as below the battery system. The means for converting a temperature difference into a voltage may be disposed in an innermost portion of the foam float.

In yet other embodiments, the outer shell of the electric power generation buoy can be shaped like a boat hull. For example, the electric power generation buoy may include a central portion shaped like the outer shell of a rectangular cuboid, having a length and a width in the horizontal plane, the length being larger than the width, and a height in the vertical direction. The height is preferably shorter than the width. The electric power generation buoy may also include two side portions, each coupled to a respective end of two opposite ends of the central portion, so that the side portions are essentially aligned with the length direction of the central portion. At least one side portion, and optionally both side portions, may be essentially shaped like the outer shell of a rectangular cuboid having one distal, lower edge that is truncated. The truncated edge is formed by an underside surface with is tilted relative to the horizontal direction by an acute angle. In such embodiments, the fuel tanks may be enclosed in the central portion. The battery system and the means for converting a temperature difference into a voltage may be disposed in one of the side portions.

Other shapes of the outer shell of the buoy can be used, and the shape of the outer shell of the buoy is preferably tailored to the way the buoy is deployed, and/or to the volume necessary to meet the power requirements of the application.

Referring to FIG. 1, an example embodiment of an electric power generation and storage buoy is illustrated. The buoy includes an air intake system 1, an equipment mounting platform 2, an exhaust pipe 3, a solar panel mounting area 4, electronics and payload enclosure 5, foam float 6, a combustion chamber 7 including a fuel burner, a Stirling-cycle engine or a thermoelectric generator array 8, a drainage pump assembly 9, a buoy spar structure 10, a fuel tank 11, a fuel pump 12, a ballast tank 13, a ballast pump and valve assembly 14, a ballast mass 15, a mooring point 16, and a mooring and electric power umbilical cable 17.

The system functions by floating vertically in the ocean such that buoy spar structure 10 is entirely submerged, and the flotation line is located at the midpoint of foam float 6.

The air intake system 1 is drawing air into the combustion chamber 7, for example, with the use of a forced air blower 21 that is located at an inner end of the air intake system 1. The fuel pump 12 is used to supply ethanol, propane, or similar hydrocarbon fuels from the fuel tank 11 to the fuel burner located in the combustion chamber 7. The fuel burner provides a heat source to the Stirling-cycle engine or the thermoelectric generator array 8.

In cases a Stirling-cycle engine is used, the engine can mechanically drive an alternator coupled to an AC-to-DC converter, thus generating electricity as heat flows from the fuel burner, through the Stirling-cycle engine, and to the surrounding ocean water. The hot side of the Stirling-cycle engine is located inside the buoy spar structure 10, in thermal contact with the fuel burner. The cold side of the Stirling-cycle engine may be located outside the buoy spar structure 10, below the flotation line. Alternatively, the cold side of the Stirling-cycle engine may be located inside the buoy spar structure 10 and be connected to a heat pipe or a heat exchanger. The heat pipe or heat exchanger includes a portion located outside the buoy spar structure 10, below the flotation line. This alternative can facilitate the implementation of a commercially available Stirling-cycle engine in the buoy spar structure 10, and/or better protect the Stirling-cycle engine from impacts and marine growth. The Stirling-cycle engine can offer a relatively high electric power generation efficiency and is able to operate for extended durations without maintenance since the entire engine assembly is sealed from the effects of the marine air.

In cases a thermoelectric generator array is used, the array directly generates electricity by Seebeck effect as heat flows from the fuel burner, through each generator of the array, and to the surrounding ocean water. Again, the hot side of each thermoelectric generator is located inside the buoy spar structure 10 in thermal contact with the fuel burner, and the cold side of each thermoelectric generator may be located outside the buoy spar structure 10, below the flotation line. Alternatively, the cold side of the thermoelectric generator may be located inside the buoy spar structure 10 and be connected to a heat pipe or a heat exchanger that includes a portion located outside the buoy spar structure 10, below the flotation line. The thermoelectric generator array is simple and reliable with no moving parts, but it may be substantially less efficient than the Stirling-cycle option.

In some preferred embodiments, the heat pipe or a heat exchanger connected to the Stirling-cycle engine or the thermoelectric generator array 8 may include a pump, working fluid that the pump circulates in a circuit, through a first heat exchanger thermally coupled to the cold side of the Stirling-cycle engine, and through a second heat exchanger located outside the buoy spar structure 10, below the flotation line (in contact with seawater when in use). The pump, working fluid circuit, and heat exchangers may add cost and consume some of the electric power generated by the buoy. However, by allowing the control of the flow of the working fluid, this system may facilitate the regulation of the temperature of the heat rejection surfaces in contact with sea water, which should ideally be hot enough to kill marine growth, but not excessively hot to cause surface pitting or a reduction of the operating efficiency of the Stirling-cycle engine or the thermoelectric generator array 8.

In some cases, Stirling-cycle engines and the thermoelectric generator array can be used together.

Regardless of whether a Stirling-cycle engine or a thermoelectric generator array is used, the combustion gas is expelled from the combustion chamber 7 through the exhaust pipe 3. The drainage pump assembly 9 is provided to drain any condensation from the combustion gas or sea water inflow from either the air intake system 1 or exhaust pipe 3.

The solar panel mounting area 4 can optionally be fitted with solar panels to supplement the electric power generated from burning fuel.

The electric power generated is stored in a battery array 26 that can be located in the electronics and payload enclosure 5. The electric power is then delivered to the equipment located on equipment mounting platform 2, which may include communications systems, sensors, cameras, radar, and/or other marine payloads.

As fuel is consumed from the fuel tank 11, the ballast pump and valve assembly 14 can be used to fill the ballast tank 13 with water to compensate for the spent fuel mass. This filling allows the buoy spar structure 10 to remain floating vertically at a relatively consistent height.

The outer shell of the foam float 6 is shaped essentially like a relatively small solid cylinder, optionally having truncated edges. The foam float 6 provides additional flotation buoyancy, while the ballast mass 15 ensures that the buoy spar structure 10 maintains a stable vertical orientation.

The mooring point 16 connects to the mooring and electric power umbilical cable 17, which can be used to anchor the system to the seafloor and provide electric power and data connectivity to subsurface payloads.

The embodiment illustrated in FIG. 1 can produce an average electric power well in excess of 1000 Watts by installing a large number of Stirling-cycle engines or the thermoelectric generator arrays 8, although the fuel will last for a shorter duration.

Figure 2:
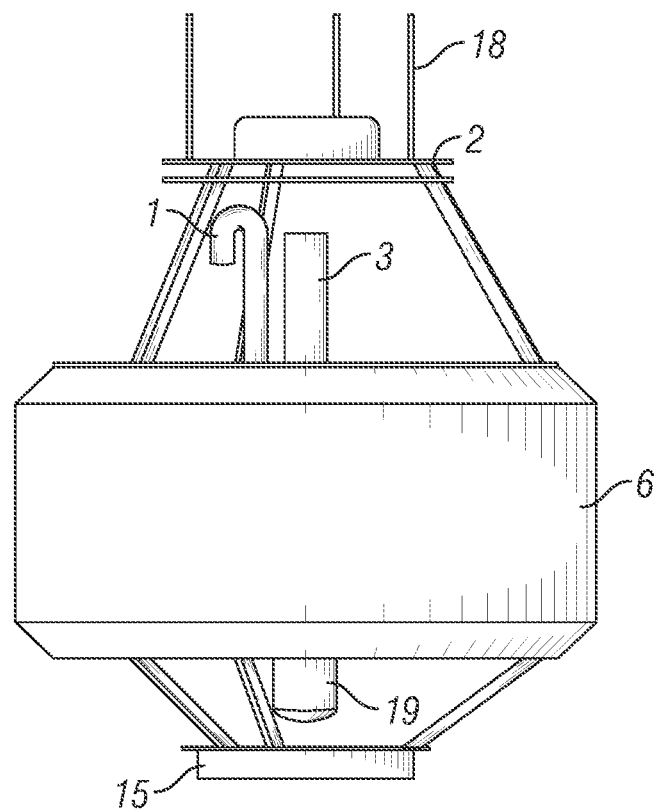
FIG. 2 is an example of a small buoy with only a single generator.
Figure 3:
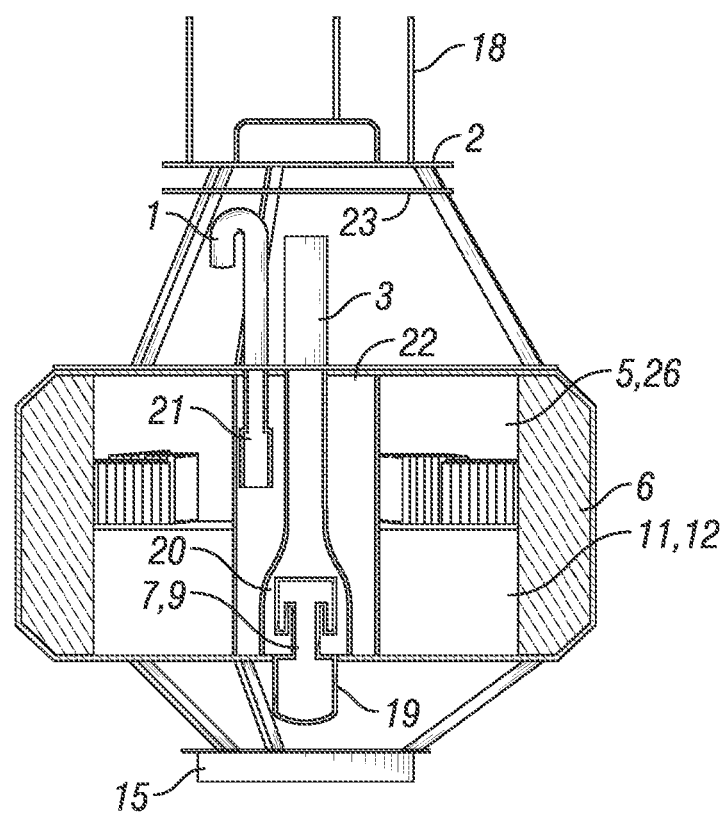
FIG. 3 is a cross section of the small buoy and single generator depicted in FIG. 2.

Referring to FIGS. 2 and 3, another example embodiment of an electric power generation and storage buoy is illustrated. The buoy is constructed from a foam float 6 which supports a metal cartridge insert containing the fuel tank 11, battery array 26, electronics, and a Stirling-cycle engine or a thermoelectric generator 8. The outer shell of the foam float 6 is shaped essentially like a relatively small solid cylinder, optionally having truncated edges. The ballast mass 15 is suspended from the bottom of the buoy for stability. The top of the buoy supports the equipment mounting platform 2, which is free of all obstructions. The cold side 19 of the Stirling-cycle engine or a thermoelectric generator 8 may be located outside the foam float 6, below the flotation line. Alternatively, the cold side of the Stirling-cycle engine or a thermoelectric generator 8 may be located inside the foam float 6 and be connected to a heat pipe or a heat exchanger (not shown) that includes a portion located outside the foam float 6. The heat pipe or heat exchanger may include a pump, a working fluid circuit, and heat exchangers, as previously discussed.

A single mooring point (not shown) can be used to secure the buoy to a mooring and electric power umbilical cable (not shown) if the buoy is used to support a seafloor payload. Automatic station-keeping is also available as an option for deployments of up to six months. The station-keeping module can include an array of small submersible thrusters that attach to the lower ballast plate surface. No water ballasting system may be required in this embodiment, since the buoy draft will change by only 0.15 meter from when the fuel tank 11 is full to when the fuel tank 11 is empty.

The combustion loop (i.e., the air intake system 1, the combustion chamber 7, and the exhaust pipe 3) is located in an internal compartment of the foam float 6. The combustion loop is fully sealed and is tolerant of flooding and submersion. Ethanol is pumped from a fuel tank 11 into a fuel burner located in the combustion chamber 7. The fuel burner preferably includes an electronic ignition and a flame-out detector. A waterproof electric air blower 21 provides airflow and forces the combustion gas out of a self-sealing flap valve.

The air intake system 1 and exhaust pipe 3 may be arranged next to each other and aligned axially. Furthermore, a heat recuperator chamber 22 is for warming the airflow by conducting heat from the combustion gas in the exhaust pipe 3 to the airflow in the heat recuperator chamber 22. This heat conduction can also reduce the temperature of the combustion gas in the exhaust pipe 3 and reduce the risk of overheating sensors and payloads nearby the exhaust pipe 3. For example, outside of the foam float 6, the air intake system 1 and exhaust pipe 3 are shown as separate pipes. Keeping the air intake system 1 and the exhaust pipe 3 separate on the outside of the foam float 6 can make the protection against water inflow easier to implement, such as with sealing flap valves. Inside of the internal compartment of the foam float 6, the air intake system 1 leads to the heat recuperator chamber 22 that surrounds the combustion chamber 7 and/or the exhaust pipe 3. Heat exchanger fins (not shown) can be provided on the combustion chamber 7 and/or the exhaust pipe 3 to improve heat conduction to the air being drawn in by the air blower 21 that flows downward in the heat recuperator chamber 22 surrounding the exhaust pipe 3. Alternatively, a fully coaxial arrangement (not shown) of the air intake system 1 and exhaust pipe 3 can be used. In such full coaxial arrangement, the combustion chamber 7 and the exhaust pipe 3 may be located at the center of the heat recuperator chamber 22 and the air intake system 1. As such, and the air is drawn in a tube surrounding the exhaust pipe 3, which is recessed below the top of the exhaust pipe 3. The fully coaxial arrangement can improve heat transfer efficiency and can occupy less space than the embodiment shown in FIGS. 2 and 3, but the protection against water inflow in the air intake system 1 can be more complicated to implement. However, the protection against water inflow in the exhaust pipe 3 can be implemented with a sealing flap valve at the top of the exhaust pipe 3, as previously discussed. Also, in order to increase the overall efficiency of the external combustion engine, the fully coaxial arrangement can include heat exchanger fins as previously discussed.

In a preferred embodiment, heat generated in the combustion chamber 7 is used to power a sealed, linear Stirling-cycle engine, which is passively cooled by seawater. A controller may be programmed to operate the engine cold side 19 at a temperature between 60 degrees C. to 80 degrees C. in order to kill any marine growth buildup. Alternatively, the controller may be programmed to operate the engine cold side 19 such that the portion of a heat pipe or heat exchanger that is located outside the foam float 6 below the flotation line is at a temperature between 60 degrees C. to 80 degrees C. In some embodiments, the engine cold side 19 can reject 1500 to 3000 Watts of heat into the seawater, and the engine drives an alternator coupled to an AC-to-DC converter that can generate up to 1000 W of electric power. The engine and generator can generate electricity at 20% to 40% net efficiency.

Figure 4:
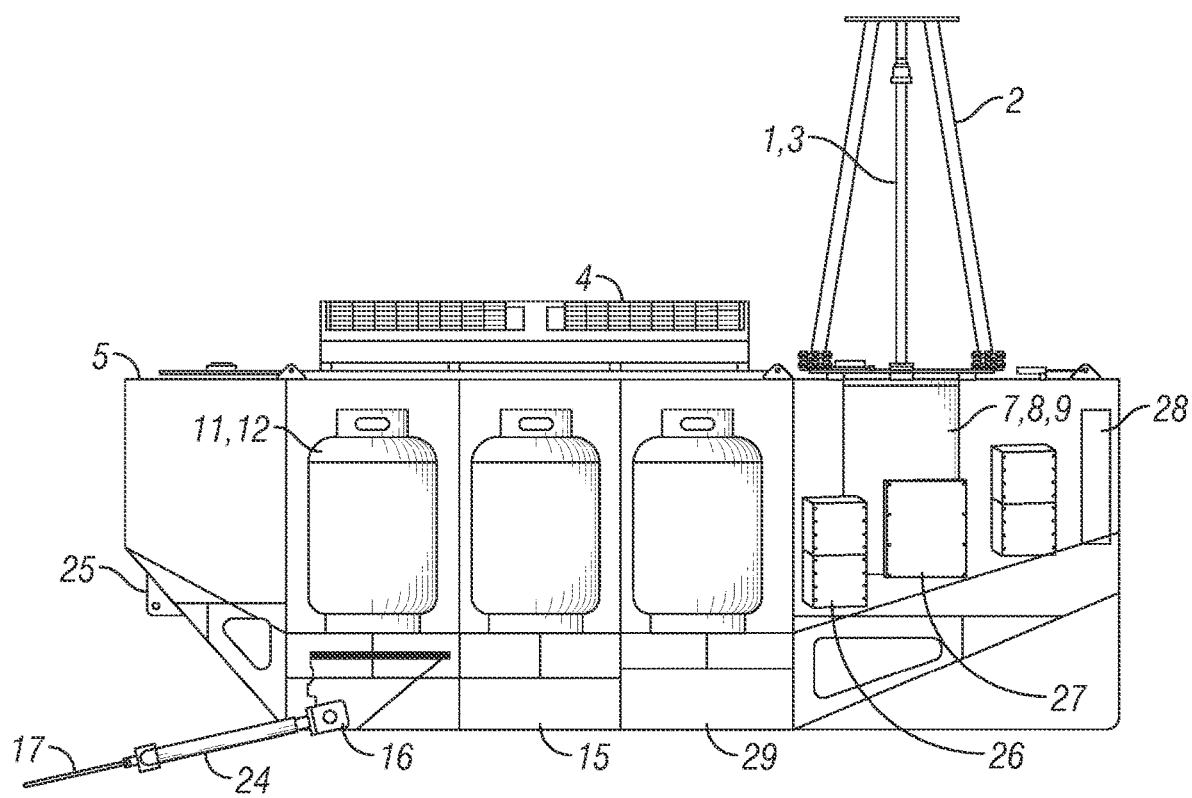
FIG. 4 is a side view a boat hull with multiple generators.
Figure 5:
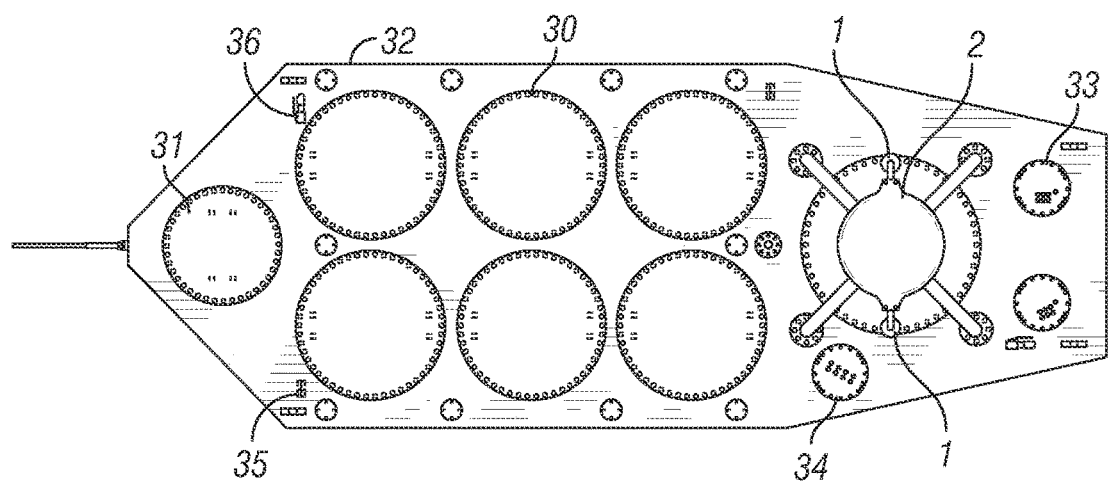
FIG. 5 is a top view of the boat hull and multiple generators depicted in FIG. 4.

An embodiment of an electric power generation and storage buoy having an outer shell shaped like a boat hull is shown in FIGS. 4 and 5. In some embodiments, the boat hull buoy can deliver approximately 1,500 kWh of electric energy from propane. Note that this energy may not be entirely available energy for the payload on location because 100 to 500 kWh may be consumed during deployment, depending on deployment duration.

Referring to FIGS. 4 and 5, the buoy includes an air intake system 1, an equipment mounting platform 2, an exhaust pipe 3, a solar panel mounting area 4, electronics and payload enclosure 5, a Stirling-cycle engine or a thermoelectric generator array 8, multiple fuel tanks 11, a ballast mass 15, a mooring point 16, and a mooring and electric power umbilical cable 17. As previously mentioned, the Stirling-cycle engine or thermoelectric generator array 8 comprises a combustion chamber 7, which may contain a drainage pump 9 and an igniter. The fuel tanks 11 may supply combustible to the generator array 8 via a fuel pump 12.

The design of the intake system 1 and exhaust pipe 3 of the buoy shown in FIGS. 4 and 5 may not be significantly different from the design of the intake system 1 and exhaust pipe 3 illustrated in FIG. 1, or FIGS. 2 and 3. In particular, the intake system 1 and/or the exhaust pipe 3 may include self-sealing flap valves.

Additional features include a mooring yoke 24, towing lug 25, onboard battery array 26, battery combiner system 27, control system 28, heat exchanger 29 thermally coupled to a cold side of the Stirling-cycle engine or a thermoelectric generator array 8, fuel tank cover 30, payload and electronics cover 31, vessel hull 32, payload connector hatch 33, solar panel connector hatch 34, relief valve 35, and purge valve 36. Foam buoys (not shown) are preferably provided below the solar panels of the solar panel mounting area 4.

The buoy shown in FIGS. 4 and 5 can be constructed using a flat plate hull, which can reduce cost and lead time. For example, the vessel hull 32 may include a central portion shaped like a rectangular cuboid. The vessel hull 32 may also include two side portions, each coupled to a respective end of two opposite ends of the central portion, so that the side portions are essentially aligned with the length direction of the central portion. At least one side portion, and optionally both side portions, may be essentially shaped like a rectangular cuboid having one distal, lower edge that is truncated. The truncated edge is formed by an underside surface with is tilted relative to the horizontal direction by an acute angle. Accordingly, the buoy can be towed out for deployment, eliminating the need for a crane.

Furthermore, the buoy shown in FIGS. 4 and 5 may allow for better modularity with fuel tank sizing and battery module installations than the buoy shown in FIG. 1, which may have more limited configuration options. For example, the vessel hull 32, which forms an outer shell of the buoy, comprises six fuel tank covers 30 or hatches that can be used for closing a corresponding plurality of cavities in the buoy. Each cavity comprises a fuel tank. The fuel tanks 11 are preferably enclosed in the central portion of the vessel hull 32, above the ballast mass 15. While in the embodiment shown in FIGS. 4 and 5 the fuel tanks 11 consist of six large fuel tanks carrying propane, the buoy can alternatively be configured to include fuel tanks carrying a variety of different fuels, and/or any other number, shape, or configuration of fuel tanks. Optionally, the Stirling-cycle engine or thermoelectric generator array 8 can additionally be designed to be dropped directly into the buoy, such as in one of the side portions of vessel hull 32. The battery array 26 and/or the combiner system 27 may also be disposed in the one of the side portions, for example, around the Stirling-cycle engine or thermoelectric generator array 8.

In the example shown, an onboard battery array 26 is included, for example, having a storage capacity of at least 25 kWh. The electric power can be stored in the onboard battery array 26. Alternatively or additionally, the electric power can be provided to onboard payloads and to a combined mooring/electric power/data umbilical cable 17 to the seafloor.

The electric power generation and storage buoy shown in FIGS. 4 and 5 allows for large capacity of fuel storage using, for example, commercially available propane tanks. The buoy can be scaled for larger capacities by extending the length of the central portion and adding fuel tanks. The buoy is preferably sized such that it can fit within a shipping container, optionally with fuel tanks shipped loose/empty or purchased locally close to the deployment site. The fuel tanks 11 stay preferably vertical for filling and installation in the buoy. The fuel tanks 11 can potentially be changed or re-filled at sea.

The buoy can include a simple communication mast, but can alternatively support a full guardship payload. The buoy can have room, such as in electronics and payload enclosure 5, for internal payload equipment with access hatches provided with the payload and electronics cover 31 and the payload connector hatch 33.

The buoy shown in FIGS. 4 and 5 may include solar panels in addition to the Stirling engine and the electric generator. For example, six high-efficiency, flexible, marine-grade panels can be installed. When used in favorable locations (e.g., Gulf of Mexico, Adriatic sea), solar panels can become the primary source of electric power with propane fuel as a back-up. The solar panels can add 30 to 100% to the total electric energy delivered.

In heavy seas, some water may inflow into the air intake system 1. A combination of passive check valves and active ball valves can be used to reduce the risk of water entry. Referring to all the Figures, the drainage pump assembly 9 located at the bottom of the combustion chamber 7 can be used to remove water inflow and condensation from the combustion gas. If the combustion chamber 7 floods, the control system 28 of the buoy can pause operation, shut off the fuel pump 12, the air blower 21, and the igniter until the combustion chamber 7 is pumped dry. Electric power can be provided from the battery array 26 to the payload while the generator is shut down. When the combustion chamber 7 has been pumped dry, and sea conditions are calm, the operation can resume. The extreme solvent nature of ethanol can be used to advantage to clear any fuel injector nozzle clogs, salt deposits, or other contamination in the combustion chamber 7 after a flooding event. Furthermore, the buoyancy of a buoy can be increased, for example, by adding unoccupied space above the waterline of the buoy. An increased buoyancy reduces the risk of deep submergence, reduces the probability of water inflow through the intake system 1 and/or the exhaust pipe 3, and reduces the gravity of such inflow when it occurs. Also, a buoy having sufficient buoyancy can be used with a single point mooring, and can still prevent submergence during a 10-year storm event.

The embodiments depicted in FIGS. 1, 4, and 5 have a target capacity of more than 1000 kilo-Watt-hours of net energy delivery to a payload. For comparison, a battery buoy capable of such net delivery would weigh tens of tons and be prohibitively expensive for most applications. The mooring and deployment costs for a battery buoy of this size would also be prohibitively expensive for most applications, while these embodiments of an electric power generation and storage buoy can easily be transported, deployed, and moored at minimal relative cost.

This electric power generation and storage buoy can be used to advantage in combination with a commercial battery sled. For example, instead of installing a large and expensive battery having a capacity in the range between 500 kilo-Watt-hours and 1000 kilo-Watt-hours, a much smaller and lower cost seafloor battery module could be deployed, with the buoy providing a continuous trickle recharge and a data connection from the sea floor to the surface. This combination could provide the same capacity, but at a lower cost, smaller size, and smaller weight.

While the disclosure is susceptible to various modifications and alternative forms, specific embodiments thereof are shown by way of example in the drawings and description. It should be understood, however, that the drawings and detailed description thereto are not intended to limit the claims to the particular form disclosed, but on the contrary, the intention is to cover all modifications, equivalents, and alternatives falling within the scope of the claims.

What is claimed is:

1. A system for generating and storing electrical power in marine environments, comprising:
   a buoy having a flotation line;
   a fuel burner disposed within the buoy;
   means for converting a temperature difference into a voltage, wherein said means comprises a thermoelectric generator having a hot side and a cold side, or electrical generator mechanically coupled to a heat engine having a hot side and a cold side;
   a battery system electrically coupled to said means; and
   a controller programmed to operate said means such that a temperature of the cold side is controlled approximately between sixty and eighty degrees Celsius,
   wherein the hot side is located inside the buoy in thermal contact with the fuel burner, and
   wherein the cold side is located outside the buoy below the flotation line, or wherein the cold side is thermally coupled to a heat pipe or heat exchanger, with the heat pipe or heat exchanger including a portion located outside the buoy below the flotation line.

2. The system of claim 1, wherein the cold side is thermally coupled to a heat pipe or heat exchanger, the system further comprising:
   a pump; and
   a circuit for circulating a working fluid through a first heat exchanger thermally coupled to the cold side of said means, and through a second heat exchanger located outside the buoy below the flotation line,
   wherein the controller is capable of driving the pump, the controller being programmed to regulate a temperature of the second heat exchanger by adjusting a circulation flow rate of the working fluid.

3. A system for generating and storing electrical power in marine environments, comprising:
   a buoy having a flotation line;
   a fuel burner disposed within the buoy;
   means for converting a temperature difference into a voltage, wherein said means comprises a thermoelectric generator having a hot side and a cold side, or electrical generator mechanically coupled to a heat engine having a hot side and a cold side; and
   a battery system electrically coupled to said means;
   a combustion chamber in which the fuel burner is located; and a pump assembly configured to drain liquids out of the combustion chamber, wherein the hot side is located inside the buoy in thermal contact with the fuel burner, and wherein the cold side is located outside the buoy below the flotation line, or wherein the cold side is thermally coupled to a heat pipe or heat exchanger, with the heat pipe or heat exchanger including a portion located outside the buoy below the flotation line.

4. The system of claim 3 wherein the fuel burner comprises an electronic ignition and a flame-out detector.

5. A system for generating and storing electrical power in marine environments, comprising:

a buoy having a flotation line;

a fuel burner disposed within the buoy;

means for converting a temperature difference into a voltage, wherein said means comprises a thermoelectric generator having a hot side and a cold side, or electrical generator mechanically coupled to a heat engine having a hot side and a cold side; and a battery system electrically coupled to said means;

a combustion chamber in which the fuel burner is located;

an intake system configured to force air into the combustion chamber; and an exhaust pipe connected to the combustion chamber, wherein the exhaust pipe or the intake system comprises a self-sealing flap valve, wherein the hot side is located inside the buoy in thermal contact with the fuel burner, and wherein the cold side is located outside the buoy below the flotation line, or wherein the cold side is thermally coupled to a heat pipe or heat exchanger, with the heat pipe or heat exchanger including a portion located outside the buoy below the flotation line.

6. The system of claim 5 wherein the intake system comprises a blower.

7. The system of claim 5 further comprising a heat recuperator chamber surrounding at least a portion of the combustion chamber or at least a portion of the exhaust pipe.

8. The system of claim 5 wherein the exhaust pipe comprises the self-sealing flap valve.

9. The system of claim 5 wherein the exhaust pipe is arranged next to a portion of the intake system and is aligned with the portion of the intake system.

10. The system of claim 5 wherein the intake system comprises the self-sealing flap valve.

11. A system for generating and storing electrical power in marine environments, comprising:

a buoy having a flotation line;

a fuel burner disposed within the buoy;

means for converting a temperature difference into a voltage, wherein said means comprises a thermoelectric generator having a hot side and a cold side, or electrical generator mechanically coupled to a heat engine having a hot side and a cold side; and a battery system electrically coupled to said means, wherein the hot side is located inside the buoy in thermal contact with the fuel burner, wherein the cold side is located outside the buoy below the flotation line, or wherein the cold side is thermally coupled to a heat pipe or heat exchanger, with the heat pipe or heat exchanger including a portion located outside the buoy below the flotation line, and wherein the buoy comprises an outer shell, the outer shell comprises a plurality of hatches for closing a corresponding plurality of cavities, and wherein each cavity comprises a fuel tank.

12. The system of claim 11 wherein each fuel tank is coupled to the fuel burner, wherein each fuel tank comprises ethanol, or wherein each fuel tank comprises propane.

13. The system of claim 11 further comprising solar panels electrically coupled to the battery system.

14. The system of claim 11 wherein said means comprises an electrical generator mechanically coupled to a heat engine, wherein the electrical generator comprises an alternator and an AC-to-DC converter, and wherein the heat engine comprises an external combustion heat engine.

15. The system of claim 14 wherein the external combustion heat engine is a Stirling-cycle engine.

16. The system of claim 11 wherein said means comprises a thermoelectric generator, and wherein the thermoelectric generator comprises an array of pairs of dissimilar semiconductors configured to generate a voltage by Seebeck effect.

17. The system of claim 11 wherein the outer shell is constructed using flat plates.

18. The system of claim 13 further comprising foam buoys below the solar panels.

* * * * *